US 6,563,568 B2

(12) United States Patent
Pierrat

(10) Patent No.: US 6,563,568 B2
(45) Date of Patent: May 13, 2003

(54) MULTIPLE IMAGE RETICLE FOR FORMING LAYERS

(75) Inventor: Christophe Pierrat, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/196,072

(22) Filed: Jul. 16, 2002

(65) Prior Publication Data

US 2002/0180947 A1 Dec. 5, 2002

Related U.S. Application Data

(62) Division of application No. 09/449,580, filed on Nov. 29, 1999, now Pat. No. 6,421,111, which is a continuation of application No. 09/132,830, filed on Aug. 12, 1998, now Pat. No. 5,995,200, which is a division of application No. 08/914,417, filed on Aug. 19, 1997, now Pat. No. 6,040,892.

(51) Int. Cl.$^7$ ............................ G03B 27/32; G03B 27/42
(52) U.S. Cl. .................................. 355/77; 355/53
(58) Field of Search ................... 355/52–53, 55, 355/67, 77; 430/5, 20, 30, 311; 250/548; 356/399–401

(56) References Cited

U.S. PATENT DOCUMENTS

| | | | |
|---|---|---|---|
| 3,716,296 A | 2/1973 | Springer et al. ................ 355/53 |
| 4,620,785 A | 11/1986 | Suzuki et al. .................. 355/53 |
| 4,748,478 A | 5/1988 | Suwa et al. ..................... 355/53 |
| 4,758,863 A | 7/1988 | Nikkel .......................... 355/40 |
| 4,803,524 A | 2/1989 | Ohno et al. ..................... 355/53 |
| 4,849,313 A | 7/1989 | Chapman et al. ................. 430/5 |
| 4,869,998 A | 9/1989 | Eccles et al. ................. 430/311 |
| 5,036,209 A | 7/1991 | Kataoka et al. ............. 250/492.2 |
| 5,049,925 A | 9/1991 | Aiton et al. .................... 355/53 |
| 5,235,626 A | 8/1993 | Flamholz et al. ............... 378/34 |
| 5,298,761 A | 3/1994 | Aoki et al. ................... 250/548 |
| 5,308,741 A | 5/1994 | Kemp ......................... 430/312 |
| 5,393,988 A | 2/1995 | Sakamoto ................. 250/492.22 |
| 5,422,491 A | 6/1995 | Sakamoto ................. 250/492.22 |
| 5,434,647 A | 7/1995 | Tanabe ......................... 355/53 |
| 5,439,764 A | 8/1995 | Alter et al. ..................... 430/5 |
| 5,451,479 A | 9/1995 | Ishibashi ...................... 430/22 |
| 5,571,643 A | 11/1996 | Bae ............................... 430/5 |
| 5,699,260 A | 12/1997 | Lucas et al. .............. 364/468.28 |
| 5,705,299 A | 1/1998 | Tew et al. ....................... 430/5 |

FOREIGN PATENT DOCUMENTS

| | | |
|---|---|---|
| EP | 0518783 | 12/1992 |
| GB | 2190215 A | 5/1986 |
| GB | 2190215 | 11/1987 |
| JP | 55-165629 | 12/1980 |
| JP | 04-212957 | 8/1982 |
| JP | 60221757 | 4/1986 |
| JP | 62-145730 | 6/1987 |
| JP | 63-73520 | 4/1988 |
| JP | 01-234850 | 9/1989 |
| JP | 02-125609 | 5/1990 |
| JP | 05-204131 | 8/1993 |
| JP | 07-211619 | 8/1995 |

*Primary Examiner*—Henry Hung Nguyen
(74) *Attorney, Agent, or Firm*—Schwegman, Lundberg, Woessner & Kluth, P.A.

(57) ABSTRACT

A multi-image reticle used to form integrated circuitry includes a two dimensional array of spaced images arranged in a matrix of controllably spaced rows and columns of images on a single reticle. No rotation of the reticle is required to expose various levels of circuitry on a semiconductor wafer. The wafer is held in a stepper device, which controllably positions the wafer under the desired image of the mask for exposure of a resist on the wafer. A movable aperture controls exposure through a selected image or mask pattern on the reticle. By controlling which image is used, and accurately positioning the wafer via the stepper, multiple images are accurately registered, leading to improvement in dimensions of circuitry and other structures formed on the wafer.

28 Claims, 2 Drawing Sheets

| LEVEL | EXPOSURE | IMAGE | PROCESS RESIST |
|---|---|---|---|
| 1 | Y | 1 | N |
| 1 | Y | 2 | Y |
| 2 | Y | 3 | N |
| 2 | Y | 4 | Y |
| 3 | Y | 5 | Y |
| 4 | Y | 6 | Y |
| 5 | Y | 7 | N |
| 5 | Y | 8 | Y |
| 6 | Y | 9 | Y |

FIG. 3

MULTIPLE IMAGE RETICLE FOR FORMING LAYERS

RELATED APPLICATIONS

This application is a Divisional of application Ser. No. 09/449,580, filed Nov. 29, 1999, now U.S. Pat. No. 6,421,111, issued Jul. 16, 2002 which is a continuation of application Ser. No. 09/132,830, filed Aug. 12, 1998, now U.S. Pat. No. 5,995,200, issued Nov. 30, 1999, which is a divisional of application Ser. No. 08/914,417, filed Aug. 19, 1997, now U.S. Pat. No. 6,040,892, issued Mar. 21, 2000 which are hereby incorporated by reference.

This invention was made with government support under Contract No. MDA972-92-C-0054, awarded by Advanced Research Projects Agency (ARPA). The Government has certain rights in this invention.

TECHNICAL FIELD OF THE INVENTION

The present invention relates generally to optical lithographic techniques used in the formation of integrated circuits and structures on a wafer. In particular, the present invention relates to a reticle having multiple exposure patterns and its use.

BACKGROUND OF THE INVENTION

Lithographic methods use multiple images or masks to expose patterns in a resist layer on a semiconductor wafer for the formation of integrated circuits and structures such as processors, ASICS and Dynamic Random Access Memory (DRAM). As manufacturing requirements call for exposure of patterns with smaller and smaller dimensions, it is becoming necessary to employ techniques which permit enhancement of the current performance of the process of photolithography. Multiple successive steps of photolithography, film-growth, deposition and implantation of impurities create a complete integrated circuit with many identical copies on the same wafer. Each copy is known as a die.

As integrated circuits have become smaller in dimensions, the photo lithographic process requires more sophistication in alignment techniques and resolution. Presently, photo lithographic processes utilize an instrument referred to as a stepper which moves and aligns the wafer based on alignment marks on a reticle containing an image or mask such that desired patterns on the wafer are exposed based on the image. The reticle contains one or more images which may be referred to as levels because each image is used to form a level on the wafer. Light of a desired wavelength is either projected through or reflected by a selected image from the reticle to expose the substrate. Phase shifting methods, and electron beams, x-rays and ion beams are also used to pattern wafers.

Initially, each reticle contained only one image for forming one level. Reticles were becoming expensive to make due to the exacting conditions required to form smaller and smaller image lines. At the same time, complex integrated circuits required more and more levels and hence a high number of reticles were required to form them. The cost of the reticles required to form the circuits was becoming great. This trend is continuing as chip densities continue to increase.

One proposed solution to this problem is described in U.S. Pat. No. 4,758,863 entitled Multi-Image Reticle. Multiple images were formed on a reticle that was then rotated to expose the wafer using a different image for each level of an integrated circuit formed on the wafer. While this proposed solution reduced the need to keep changing reticles, it still introduced error into the image alignment process. First, each image had to be properly placed at different angles with respect to each other on the reticle. This introduced a rotational alignment error. Error was also introduced when a reticle was not perfectly centered. Rotation of the mask then produced a radial registration error. In addition, the angle of rotation of the mask holder introduced a further rotational alignment error. These errors made it difficult to properly align each reticle based on alignment images through the use of microscopes and other automatic alignment systems. To overcome rotational errors, a further degree of freedom than just movement in the x and y direction was required.

One further problem with this solution is that it left much space unused on the mask. Up to four images are shown on a reticle. There is wasted space, and a practical limit of about four square images which can be used. If more than four square images are used, they must be located further from the center of the reticle to fit within a slice of the reticle. This would further waste space on the reticle.

There is a need to reduce the alignment error inherent in the use of multiple images on a reticle, and there is a further need to increase the number of images and hence reduce the cost of reticles.

SUMMARY OF THE INVENTION

A multi-image reticle comprises a two dimensional array of spaced images or mask patterns arranged in a matrix of controllably spaced rows and columns on a single reticle. The images are aligned consistently in the same direction such that no rotation of the reticle is required to expose the levels on a wafer. The wafer is located on a stepper, which controllably positions the wafer under the desired image of the mask for exposure of a resist on the wafer. In one embodiment, X and Y controlled opaque blades or shutters are used to define a movable aperture to allow exposure to occur only through a selected image on the reticle. In a further embodiment, a focussing device is moved to control which image is used. By controlling which image is used, and accurately positioning the wafer via the stepper, multiple images are accurately and repeatably registered, leading to improvement in dimensions of circuitry and other structures formed on the wafer.

In one embodiment, the images are designed for use with a phase shifting reflective and/or refractive mask. In this embodiment, radiation is reflected by each multi layer image to take advantage of interference patterns which are controlled to obtain desired exposure of the resist. Near the boundaries of exposed resist corresponding to the edge of the images on the reticle, the exposure received may be near zero. This can lead to undesired lines being "printed." To prevent the printing of such undesired lines, a second image on the reticle, either adjacent to the first, or placed anywhere else on the reticle is positioned to expose a second pattern over the first exposure to remove such lines prior to processing of the resist. Since no additional alignment errors are introduced, excellent registration with the previous exposure is obtained. Further images may also be aligned and exposed prior to processing the resist if desired.

Reticle costs are reduced because nine or more image patterns are located on the same reticle. Misregistration is reduced due to the ability of the stepper to position the target under the correct image using global x and y degrees of freedom without introducing errors through rotation of the reticle or having to load and accurately register a new mask.

Optimal use of reticle space is made by use of an array of optimally laid out multi size rectangular images allowing a great reduction in the number of reticles and hence cost and time required to manufacture them. This can be a significant cost savings with respect to the manufacture of complex devices such as memory arrays, ASICs, processors and other integrated circuits.

The invention is particularly useful where multiple exposures are used prior to processing a resist to strip away desired areas. Since the level spacing is tightly controlled, and no unload and load of a new mask is required, registration of the two exposures is extremely consistent. Many different types of lithography may be used, including photolithography using either reflective or refractive photomasks, electron beam lithography, x-ray lithography and ion beam lithography to name a few.

BRIEF DESCRIPTION OF THE DRAWINGS

FIG. 3 is a table of images on the reticle of FIG. 1 used to form each layer on a semiconductor wafer.

DETAILED DESCRIPTION OF THE INVENTION

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined by the appended claims.

In the process of forming a pattern by use of photolithography, it is customary that a member used to pattern one integrated circuit on a semiconductor wafer is termed a reticle, and a member for exposing the entire wafer is termed a mask; or a member corresponding to an original sheet is termed a reticle, and a member obtained by duplicating such a reticle is termed a mask. In the present invention, a device for holding multiple such masks and reticles classified by such various definitions is referred to as a reticle for convenience. The terms image and mask pattern are used to refer to a structure on the reticle that is used to modify radiation such that it modifies a radiation sensitive material called a resist on a semiconductor wafer in a desired manner. It may do so by reflection, refraction or a combination of both. The radiation may be in the any range of the electromagnetic spectrum suitable for modifying the resist. The modification of the radiation also comprises phase shifting methods to obtain suitable interference patterns.

Figure 1:
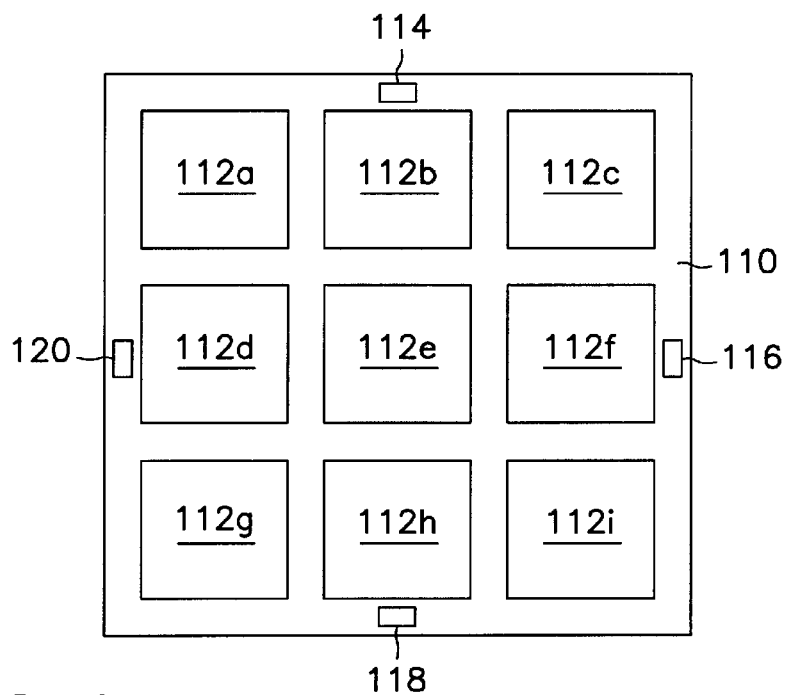
FIG. 1 is a plan view of one embodiment of a multi-image reticle.

With reference to FIG. 1, a multi-image reticle 110 comprises a transparent substrate which is generally planar and essentially free of defects on the surfaces, as well as internally, and should have high optical transmission or reflection at a desired resist exposure wavelength. Several types of glasses have been used for making reticles, including: soda-lime glass, borosilicate glass, and quartz. However, quartz is the type of glass used in this embodiment. Other materials compatible with the resist process are acceptable, particularly when a material has favorable transmissivity characteristics when the wavelength of the exposure light source is less than 180 nm.

After the reticle 10 has been polished, cleaned and inspected, it is ready to be coated by reflective materials to form multiple integrated circuit mask patterns or images 112a, 112b, 112c, 112d, 112e, 112f, 112g, 112h, and 112i which are spaced in rows and columns in a rectangular array. There are nine such images shown in FIG. 1. The nine images are arranged in three rows and three columns having substantially equal spacing between each image in each row and between each image in each column. It should be noted that the number of such images on the reticle may be varied to include fewer or thirty or more images depending on the physical limitations mandated by equipment and design rules for forming semiconductor circuitry. The spacing of such images may also be varied by the designer, but should be consistent with control parameters of a stepper described below. The reflective materials have refractive indices and absorption coefficients which determine a reflectivity and phase shift provided. In a phase shifting reflective photomask, radiation is reflected by the images such that constructive and destructive interference takes place favorably to form a highly resolved pattern on a desired surface. In a refractive or transmittive photo mask as described with reference to FIG. 2, radiation is transmitted through the reticle to expose a photo resist in a desired pattern on a semiconductor wafer. It should be noted that reticles containing images suitable for many kinds of lithographic processes, including photolithography using either reflective and refractive photomasks, electron beam lithography, x-ray lithography and ion beam lithography to name a few, may also be used without departing from the scope of the present invention.

A plurality of alignment images 114, 116, 118 and 120 are also provided on the periphery of reticle 110. These images are used in a known manner to provide for registration of the reticle and images projected on a wafer such that the images projected are properly aligned with previously formed structures on the wafer. They may be placed in various positions to ensure proper alignment of the reticle and registration of the images.

Figure 2:
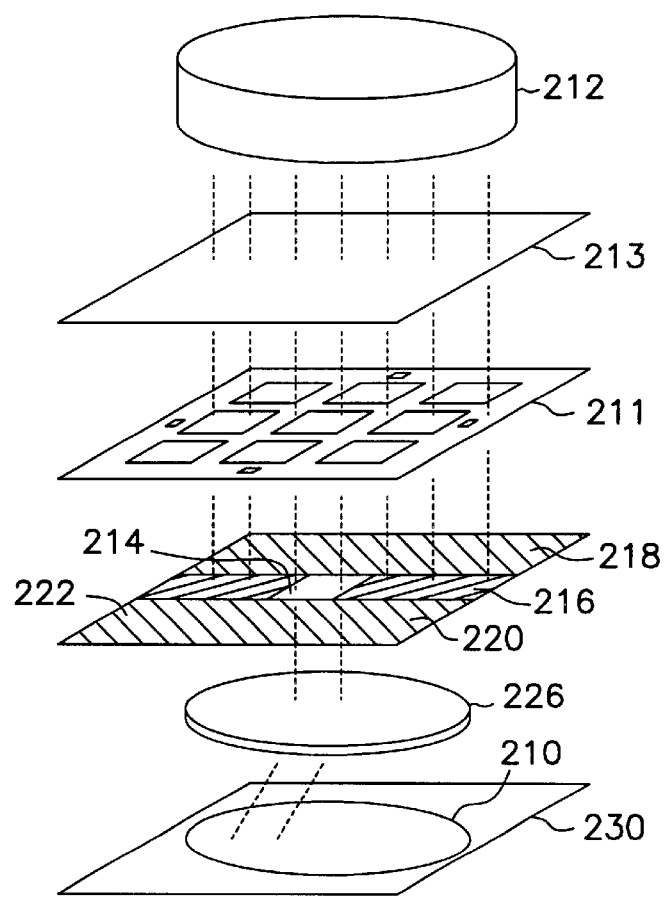
FIG. 2 is an elevational block diagram view illustrating the use of the multi-image reticle.

Each of the images in a reticle 211 comprise suitable patterns for forming circuitry on a suitably prepared substrate of a semiconductor wafer as shown at 210 in FIG. 2 using well known lithography techniques employing a resist which is conventionally applied to the wafer as desired. The resist is exposed using radiation controlled by selected images on the reticle, then processed to remove the exposed areas which are processed using conventional film growth, deposition, implantation and other techniques. Then, the remainder of the resist is usually removed and then reapplied prior to the next exposure cycle.

A conventional controlled radiation source 212 such as a lamp, selectively projects radiation, first through a condenser 213, through the reticle 211 and then through an aperture 214 provided by conventional aperture blades 216, 218, 220 and 222. The aperture blades are movable as desired to cause the radiation from a single desired image on reticle 211 at any one time to pass. While shown in an exploded block diagram form, it is recognized that the aperture blades are much closer to the reticle 211 than shown. The radiation passing through the aperture is focussed by projection optics 226 onto the wafer 210. Wafer 210 is coupled to a conventional stepper 230 to provide exposure of a resist in a controlled manner. Wafer 210 comprises conventional semiconductor wafers of any size and material. In one embodiment, a silicon wafer of between 5 and 12 inches is used.

Since many identical circuits are formed on wafer 210, stepper 230 is used to step the radiation pattern through each of the separate circuits, referred to as die. When they are fully formed, each die will be cut and encapsulated to form an integrated circuit chip. The stepper 230 is a very precise instrument which can repeatably step from die to die once the initial image is properly registered. Since the reticle contains multiple images, it need only be aligned precisely once in a reticle holder of the stepper in order to be positioned correctly relative to the wafer. It is then used to help form multiple layers of circuitry. Thereafter, the moveable aperture 214 and stepper 230 are used to control which image is projected, and where it is projected. It is an easy matter to control the spacing of the images on the reticle when making the reticle to ensure that registration of images on the wafer is maintained by the stepper once initially registered. Misregistration is reduced due to the ability of the stepper to position the target under the correct image using global x and y degrees of freedom, without introducing errors through rotation of the reticle or having to load and accurately register a new mask. Optimal use of reticle space is made by use of a rectangular array of rectangular images consistently aligned in the same direction allowing a great reduction in the number of reticles and hence cost and time required to manufacture them. The blades 214, 216, 218, and 220 need only be moved back and forth to move the aperture to allow light to project onto the correct image. No rotation of the reticle is required. The reticle may also be moved in the x and y direction in order to position images to make use of desired lens 226 characteristics. The use of multiple images on a single reticle can be a significant cost savings with respect to the manufacture of complex devices such as memory arrays, ASICs, processors and other integrated circuits.

In a further embodiment, images may be of different sizes and shapes as shown in the reticle 211 of FIG. 2. This permits optimal use of space on the reticle by allowing placement of images as desired. Since images are usually rectangular in shape, their edges line up nicely with little space between them. This is highly contrasted with the prior art method requiring rotation of the reticle to use different images. Each such image must fit within a pie shape, which inherently leads to inefficient utilization of reticle space. Larger images must be located further from the center of the reticle in order to fit within the pie shape. They still must line up with the circuit being formed when correctly rotated.

In one embodiment, each image on the reticle of the present invention is used to help form one level of circuitry or structure. Up to nine different levels may be formed using the reticle shown in FIG. 1. With more images on the reticle, even higher numbers of levels may be formed. This provides a great savings in the cost of forming circuitry, as the cost of each reticle can be a significant part of the cost of manufacturing the circuitry. Some circuitry can require more than 20 different levels to form. By greatly reducing the number of reticles required, significant cost savings are obtained. It can also take significant time to form each reticle. The reduction in the number of reticles thus saves significant time.

One further benefit of the present invention is the ability to perform multiple exposures prior to processing the resist. This is very useful in embodiments which use phase shift based lithography. In such embodiments, radiation is reflected by each multi layer image to take advantage of interference patterns which are controlled to obtain desired exposure of the resist. Near the boundaries of exposed resist corresponding to the edge of the images on the reticle, the exposure received may be near zero. This can lead to undesired lines being "printed." To prevent the printing of such undesired lines, a second image on the reticle, either adjacent to the first, or placed anywhere else on the reticle is positioned to expose a second pattern over the first exposure to remove such lines prior to processing of the resist. Since no additional alignment errors are introduced, excellent registration with the previous exposure is obtained. Further images may also be aligned and exposed prior to processing the resist if desired. FIG. 3 illustrates the use of multiple exposures using a nine image reticle to form six levels. The first level is exposed using both the first and second images prior to processing of the resist. The second level is exposed using the third and fourth images prior to processing the resist. The third and fourth levels are exposed using the fifth and sixth images respectively with the resist being processed each time. Level five also is exposed to two images, seven and eight, prior to resist processing, while level six is only exposed using image nine.

While the invention has been described with respect to particular embodiments, it will be recognized by those skilled in the art that other embodiments may also be used with the present invention. The number of images per reticle, and their shape and spacing may be varied without departing from the scope of the present invention. Further, different frequencies of radiation may also be used with suitable resists.

What is claimed is:

1. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer; and processing a layer of the wafer between exposing at least two of the patterns onto the wafer, wherein the different patterns are arranged in rows and columns.

2. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer; and processing a layer of the wafer between exposing at least two of the patterns onto the wafer, wherein at least two reticle patterns correspond to one level of circuitry to be formed on the wafer and each one of the remaining reticle patterns correspond to various levels of circuitry to be formed on the substrate.

3. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer;

processing a layer of the wafer between exposing at least two of the patterns onto the wafer; and changing the relative positions of the wafer and reticle for further exposing another die on the wafer to different ones of the patterns.

4. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer; and processing a layer of the wafer between exposing at least two of the patterns onto the wafer, comprising applying a layer of photoresist to the wafer.

5. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer;

processing a layer of the wafer between exposing at least two of the patterns onto the wafer; and exposing at least two further patterns onto the same layer of the wafer.

6. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the die;

changing the relative positions of the wafer and the reticle patterns only in x and y axes, without relative rotation therebetween, for exposing different ones of the patterns onto the same die on the wafer; and processing a layer of the wafer between exposing at least two of the patterns onto the wafer.

7. A method for exposing a single integrated circuit die on a wafer containing a plurality of dice, comprising:

providing a source of radiation;

providing projection optics for directing radiation from the source to desired location;

positioning a reticle in the desired location to receive radiation from the source of radiation and form an image on the die, the reticle comprising multiple different patterns for the integrated circuit die, all of the patterns being oriented in the same direction on the reticle and at least some of the reticle patterns representing different entire layers of the same die;

moving at least one of the wafer and the reticle patterns relative to the other only in x and y axes, without relative rotation therebetween, for exposing different ones of the patterns onto the same die on the wafer; and processing a layer of the wafer between exposing at least two of the patterns onto the wafer, where moving the wafer and/or the reticle preserves the same angular orientation between the wafer and the reticle.

8. The method of claim 1 wherein the patterns in each row are equally spaced.

9. The method of claim 1 wherein the patterns in each column are equally spaced.

10. The method of claim 1 wherein the patterns are rectangular.

11. The method of claim 2 wherein the different patterns are arranged in rows and columns.

12. The method of claim 2 wherein the patterns are rectangular.

13. The method of claim 3 wherein at least two reticle patterns correspond to one level of circuitry to be formed on the wafer and each one of the remaining reticle patterns correspond to various levels of circuitry to be formed on the substrate.

14. The method of claim 3 wherein the different patterns are arranged in rows and columns.

15. The method of claim 4 further comprising changing the relative positions of the wafer and reticle for further exposing another die on the wafer to different ones of the patterns.

16. The method of claim 4 wherein at least two reticle patterns correspond to one level of circuitry to be formed on the wafer and each one of the remaining reticle patterns correspond to various levels of circuitry to be formed on the substrate.

17. The method of claim 4 wherein the different patterns are arranged in rows and columns.

18. The method of claim 5 where processing a layer of the wafer comprises applying a layer of photoresist to the wafer.

19. The method of claim 5 further comprising changing the relative positions of the wafer and reticle for further exposing another die on the wafer to different ones of the patterns.

20. The method of claim 5 wherein at least two reticle patterns correspond to one level of circuitry to be formed on the wafer and each one of the remaining reticle patterns correspond to various levels of circuitry to be formed on the substrate.

21. The method of claim 5 wherein the different patterns are arranged in rows and columns.

22. The method of claim 6 further comprising coating the wafer with a resist before providing the radiation.

23. The method of claim 6 further comprising performing at least one additional circuit manufacturing process on the single integrated circuit die to form a second circuit layer in registration with the processed layer.

24. The method of claim 7 further comprising exposing at least two further patterns onto the same layer of the wafer.

25. The method of claim 7 where processing a layer of the wafer comprises applying a layer of photoresist to the wafer.

26. The method of claim 7 further comprising changing the relative positions of the wafer and reticle for further exposing another die on the wafer to different ones of the patterns.

27. The method of claim 7 wherein at least two reticle patterns correspond to one level of circuitry to be formed on the wafer and each one of the remaining reticle patterns correspond to various levels of circuitry to be formed on the substrate.

28. The method of claim 7 wherein the different patterns are arranged in rows and columns.

* * * * *